(12) United States Patent
Saito et al.

(10) Patent No.: US 7,824,754 B2
(45) Date of Patent: Nov. 2, 2010

(54) PEELING SHEET WITH ADHESIVE OF EPOXY ACRYLATE, NON-UNSATURATED RESIN AND BIS(METHACRYLOYLOXYETHYL) HYDROGEN PHOSPHATE

(75) Inventors: Masao Saito, Tochigi (JP); Osamu Takamatsu, Tochigi (JP); Takayuku Matsushima, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 12/662,931

(22) Filed: May 12, 2010

(65) Prior Publication Data

US 2010/0227101 A1 Sep. 9, 2010

Related U.S. Application Data

(60) Division of application No. 12/010,172, filed on Jan. 22, 2008, now Pat. No. 7,754,790, which is a continuation of application No. 11/514,192, filed on Sep. 1, 2006, now abandoned, which is a continuation of application No. 10/844,307, filed on May 12, 2004, now abandoned, which is a continuation of application No. 09/631,278, filed on Aug. 3, 2000, now abandoned.

(30) Foreign Application Priority Data

Aug. 12, 1999 (JP) ................................. 11-228101

(51) Int. Cl.
*B32B 7/10* (2006.01)
*C08K 9/02* (2006.01)
*C08L 63/10* (2006.01)

(52) U.S. Cl. ...................... 428/41.5; 523/204; 523/427; 523/451

(58) Field of Classification Search ........................ None
See application file for complete search history.

(56) References Cited

U.S. PATENT DOCUMENTS

| | | | |
|---|---|---|---|
| 3,373,075 A | 3/1968 | Fekete et al. |
| 4,532,074 A | 7/1985 | Labib et al. |
| 4,791,160 A | 12/1988 | Kato et al. |
| 5,127,158 A | 7/1992 | Nakano |
| 5,596,028 A | 1/1997 | Yanagi et al. |
| 5,854,325 A | 12/1998 | Hosomi et al. |
| 5,883,193 A | 3/1999 | Karim |
| 5,965,064 A | 10/1999 | Yamada et al. |
| 6,001,533 A | 12/1999 | Sega et al. |
| 2008/0226884 A1 | 9/2008 | Sim et al. |

FOREIGN PATENT DOCUMENTS

| | | |
|---|---|---|
| EP | 0 878 527 A1 | 5/1998 |
| EP | 893 484 A2 | 1/1999 |
| JP | 61-276873 | 12/1986 |
| JP | A-02-47121 | 2/1990 |
| JP | A-06-199994 | 7/1994 |
| JP | 8-302301 | 11/1996 |
| JP | 09-25467 | 1/1997 |
| JP | A-10-46109 | 2/1998 |
| JP | A-63-83184 | 4/1998 |
| JP | A-63-92618 | 4/1998 |
| JP | A-11-97482 | 4/1999 |
| KR | 97-009578 | 6/1997 |
| WO | WO 98/21287 | 5/1998 |

OTHER PUBLICATIONS

Chemical abstracts registry No. 53814-24-7 for bisphenol A-epichlorohydrin copolymer diacrylate VR-60 NKOligo EA 1020, 1988.

*Primary Examiner*—Robert Sellers
(74) *Attorney, Agent, or Firm*—Oliff & Berridge, PLC

(57) ABSTRACT

An insulating adhesive film and an anisotropically electroconductive adhesive film satisfying low-temperature curability, high adhesion and high reliability are provided. An anisotropically electroconductive adhesive film of the present invention is so configured that electroconductive particles 7 are dispersed in an insulating adhesive resin 6, comprising as main components: a radical polymerizable resin component having an unsaturated double bond; a resin component having no unsaturated double bond; a phosphoric acid-containing resin component; and a radical polymerization initiator.

6 Claims, 1 Drawing Sheet

PEELING SHEET WITH ADHESIVE OF EPOXY ACRYLATE, NON-UNSATURATED RESIN AND BIS(METHACRYLOYLOXYETHYL) HYDROGEN PHOSPHATE

This is a Divisional of application Ser. No. 12/010,172 filed Jan. 22, 2008, now U.S. Pat. No. 7,754,790, which in turn is a Continuation of application Ser. No. 11/514,192 filed Sep. 1, 2006, now abandoned, which in turn is a Continuation of application Ser. No. 10/844,307 filed May 12, 2004, now abandoned, which in turn is a continuation of application Ser. No. 09/631,278 filed Aug. 3, 2000, now abandoned. The disclosure of the prior applications is hereby incorporated by reference herein in its entirety.

BACKGROUND

1. Field of the Invention

The present invention relates to an insulating adhesive and an anisotropically electroconductive adhesive for use in, for example, establishing electric connections between circuit boards. More particularly, it relates to an insulating adhesive and an anisotropically electroconductive adhesive curable at low temperatures.

2. Description of the Related Art

In recent years, as countermeasures against the miniaturization of portable remote terminals such as portable telephones, and a crack in a liquid crystal cell or glass, there has been extensively examined the practical utilization of a so-called "plastic film liquid crystal" obtained by replacing the glass of the liquid crystal cell with plastic.

Conventionally, the connection between a liquid crystal panel and a circuit component such as a TCP (Tape Carrier Package) has been accomplished by solder, an anisotropically electroconductive adhesive film, heat seal, or the like. However, a thermosetting anisotropically electroconductive adhesive film has been mainstream in response to the trend toward a smaller pitch and a narrower frame, and from the viewpoints of high adhesion and high reliability. Thus, the plastic film liquid crystal is also required to be connected by the anisotropically electroconductive adhesive film.

The anisotropically electroconductive adhesive film is originally designed under the assumption that the connection between glass and TCP, or the like is established by compression bonding connection at high temperatures and high pressures, for a short time. In a common case, the connection is established, for example, at a temperature of 170° C. for about 20 seconds. Even in the case for a low-temperature connection, it is established at a temperature of 150° C. for around 20 seconds.

However, the plastic film liquid crystal which is a material to be joined is manufactured by laminating an organic material of a protective layer or the like on mainly polyether sulphone or polycarbonate. Therefore, at the compression bonding temperatures thereof, the film may undergo thermal deformation which will not occur with glass, or cracks occur in ITO (Indium Tin Oxide) electrodes, thereby causing a display failure.

For these reasons, the anisotropically electroconductive adhesive film for connecting the plastic film liquid crystal is required to have the characteristics of establishing the connection at 140° C. or less, and under low pressures. However, in actuality, among the existing anisotropically electroconductive adhesive films, there is almost no one which is connectable at 140° C. or less, and even the one connectable at 140° C. or less has a low reliability.

Heretofore, the thermosetting anisotropically electroconductive adhesive films which can provide high reliability include various epoxy resins as main components, and there have been dominant the ones obtained by adding a so-called latent curing agent prepared by micro-capsulating or blocking an amine-based or imidazole-based curing agent, Lewis acid, or other curing agent thereto, and processing and forming the mixture into a film.

Alternatively, there are also other films obtained by adding various resins such as thermosetting elastomers and thermoplastic elastomers, thermosetting resins, thermoplastic resins, tackifiers, fillers, and coupling agents thereto for the purpose of improving various characteristics such as adhesion, moisture resistance, and stickiness.

However, for the conventional anisotropically electroconductive adhesive films using such curing agents, since a compression bonding temperature of 150° C. or more is required for breaking or melting of the microcapsules, or for dissociation of the blocking agents, the foregoing requirements cannot be satisfied. Whereas, for the curing agents connectable at 150° C. or less, since the usable time length of the anisotropically electroconductive adhesive film (film life) is short, it is difficult to use the film in actual manufacturing thereof.

On the other hand, as the anisotropically electroconductive adhesive films which do not contain epoxy resins as main components, there is proposed one of the radical polymerization type obtained by effecting polymerization with an unsaturated bond catalyst (Japanese Patent Laid-Open Publication No. Sho 61-276873) by the applicant of the present invention, and the like. However, there has not been yet developed any anisotropically electroconductive adhesive film which satisfies the requirements of low-temperature curability, high adhesion, high reliability, and the like.

SUMMARY

The present invention has been achieved for solving such problems in the prior art. It is therefore an object of the present invention to provide an insulating adhesive film and an anisotropically electroconductive adhesive film which satisfy requirements of low-temperature curability, high adhesion, and high reliability.

The present inventors have conducted an intensive study thereon in order to solve the foregoing problems. As a result, they have found the following fact. That is, an adhesive which is curable at low temperatures, and has high adhesion and reliability can be obtained by mixing a radical polymerizable resin component having an unsaturated double bond, a resin component having no unsaturated double bond, and a phosphoric acid-containing resin component. Thus, they have completed the present invention.

A first aspect of the present invention achieved based on such a discovery pertains to a low-temperature setting adhesive characterized by containing as main components, a radical polymerizable resin component having an unsaturated double bond, a resin component having no unsaturated double bond, a phosphoric acid-containing resin component, and a radical polymerization initiator.

In accordance with a second aspect of the present invention, it is also effective that a phosphate-based coupling agent is further mixed therein in the first aspect of the present invention.

Further, in accordance with a third aspect of the present invention, it is also effective that the phosphoric acid-containing resin component has a radical polymerizable reactive group of the present invention.

Whereas, a fourth aspect of the present invention pertains to an anisotropically electroconductive adhesive characterized in that electroconductive particles are dispersed in the low-temperature setting adhesive according to the present invention.

In accordance with a fifth aspect of the present invention, it is also effective that the electroconductive particle comprises a resin particle which is deformed when applied with pressure as a nucleus, and an electroconductive metal thin layer provided on a surface layer portion thereof according to the present invention.

Further, in accordance with a sixth aspect of the present invention, it is also effective that an insulating layer is provided on the metal thin layer of the electroconductive particle of the present invention.

On the other hand, a seventh aspect of the present invention pertains to an insulating adhesive film characterized by including a peeling sheet, and the above mentioned low-temperature setting adhesive, the adhesive being provided on the peeling sheet by coating and drying.

An eighth aspect of the present invention pertains to an anisotropically electroconductive adhesive film characterized by including a peeling sheet, and the above mentioned anisotropically electroconductive adhesive, the adhesive being provided on the peeling sheet by coating and drying.

In the present invention having the foregoing structure, the high adhesion based on the large polarity of the phosphoric acid can be obtained by the reaction between the radical polymerizable resin component having an unsaturated double bond and the phosphoric acid-containing resin component upon thermo compression bonding.

Consequently, according to the present invention, even when curing is effected at low temperatures, a desired initial adhesion force can be obtained, thereby ensuring the connection between electrodes while maintaining the deformed state thereof during compression bonding. Therefore, it becomes possible to improve the continuity resistance and the continuity reliability.

DETAILED DESCRIPTION OF EMBODIMENTS

Below, preferred embodiments of the present invention will be described in details with reference to the drawings.

The present invention is applicable for both of the anisotropically electroconductive adhesive having electroconductive particles and the insulating adhesive having no electroconductive particle. Further, either liquid or film-like adhesive is acceptable. In each embodiment of the present invention, a description will be given to a film-like anisotropically electroconductive adhesive as an example.

Figure 1A:
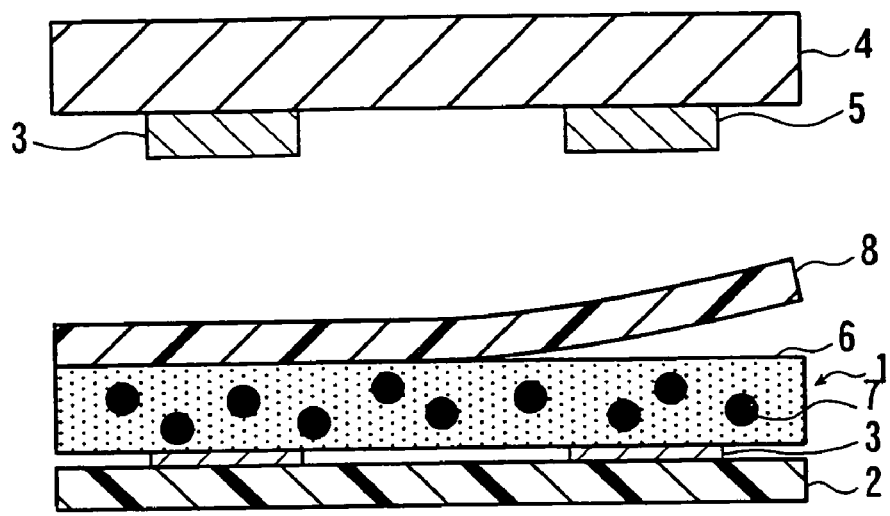
FIG. 1(a) is a view illustrating the configuration showing the state prior to the thermo compression bonding of a preferred embodiment of an anisotropically electroconductive adhesive film in accordance with the present invention.
Figure 1B:
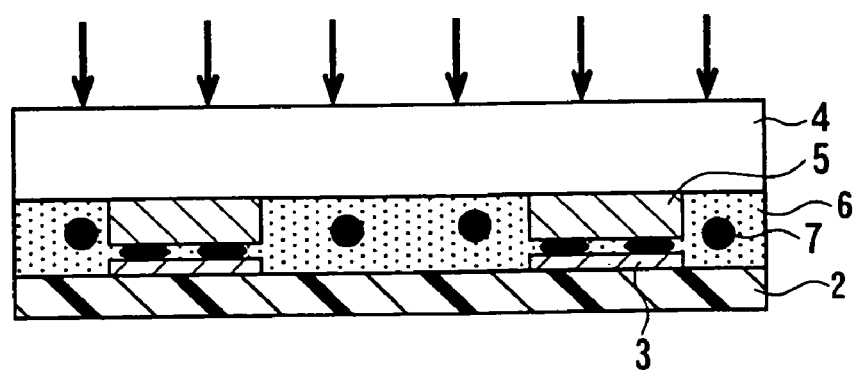
FIG. 1(b) is a view illustrating the configuration showing the state posterior to the thermo compression bonding of the preferred embodiment of an anisotropically electroconductive adhesive film in accordance with the present invention.

Referring now to FIGS. 1(a) and 1(b), an anisotropically electroconductive adhesive film 1 of the present invention is used for the connection of ITO electrodes 3 formed on a resin film 2 with terminals 5 of a circuit board 4 such as the TCP or FPC (Flexible Printed Circuit), or connection thereof with bumps formed on an LSI chip not shown. It is so configured that electroconductive particles 7 are dispersed in a film-like insulating adhesive resin 6 formed on a peeling sheet 8.

In the present invention, the insulating adhesive resin 6 contains, as main components, a radical polymerizable resin component having an unsaturated double bond, a resin component having no unsaturated double bond, a phosphoric acid-containing resin component, and a radical polymerization initiator.

Here, examples of the radical polymerizable resin component having an unsaturated double bond include (meth)acrylate resins each having at least one or more (meth)acryloyl groups in one molecule and modified products thereof, unsaturated polyester diallyl phthalate resins, vinyl ester resins, bismaleimide resins, and the like, and modified products thereof, and various monomers for viscosity adjustment.

Out of these, the cured product of epoxy acrylate represented by the following chemical formula is particularly preferred in terms of chemical resistance, toughness, and adhesion.

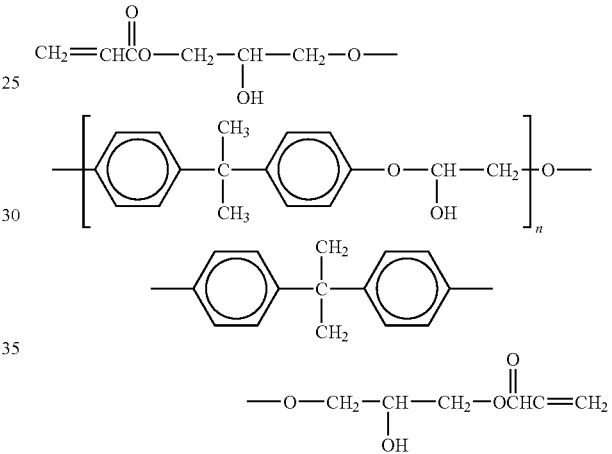

wherein n is from 0 to 20.

Examples of the resin component having no unsaturated double bond include phenoxy resins and modified products thereof, urethane resins and modified products thereof, acrylic rubbers and modified products thereof, polyvinyl butyral and polyvinyl acetal, and modified products thereof, cellulose derivatives and modified products thereof, polyol resins and modified products thereof, rubber-like resins such as polystyrene-polyisoprene-polystyrene (SIS), polystyrene-polybutadiene-polystyrene (SBS), polystyrene-poly(ethylene-butylene)-polystyrene (SEBS), and polystyrene-poly(ethylene-propylene)-polystyrene (SEPS), and modified products thereof.

Out of these, the phenoxy resin represented by the following chemical formula is particularly preferred in terms of chemical resistance and toughness.

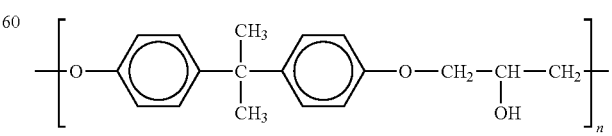

wherein n is from 1 to 50

On the other hand, examples of the phosphoric acid-containing resin component include phosphoric acid-containing (meth)acrylate and phosphorus-containing polyester resins.

Out of these, the one having a radical polymerizable reactive group is preferably used from the viewpoint of improving the heat resistance, chemical resistance, and the like.

For example, the phosphoric acid acrylate (acryloyloxy ester-ashed phosphate) represented by the following chemical formula can be preferably used.

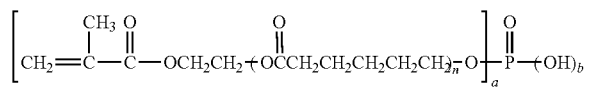

[where n is 0 to 1 in terms of a mean value, and a and b are about 1.5 in terms of a mean value.]

Further, as the radical polymerization initiator, in addition to organic peroxides represented by the following chemical formula:

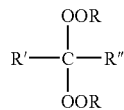

a light initiator can also be used.

Further, a curing promoter, a supplement accelerator, and a polymerization inhibitor can also appropriately be added to the initiators. Furthermore, latency can also be imparted to the radical polymerization initiators and the like by capsulation or blocking thereof.

Still further, various coupling agents can also be added to the insulating adhesive resin 6 of the present invention.

For example, the vinylsilane coupling agent represented by the following chemical formula:

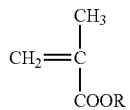

and phosphate-based coupling agents can be preferably used.

In particular, the phosphate-based coupling agents can be preferably used from the viewpoint of improving the adhesion. A typical phosphate-based coupling agent is isopropyl (dioctylpyrophosphate) titanate (KR38S manufactured by Ajinomoto Co., Inc.).

In the present invention, for more effectively attaining the foregoing object, the mixing ratio of a radical polymerizable resin component having an unsaturated double bond, a resin component having no unsaturated double bond, and a phosphoric acid-containing resin component relative to the insulating adhesive resin 6 is preferably 15 to 85% by weight for the radical polymerizable resin component having an unsaturated double bond, 30 to 90% by weight for the resin component having no unsaturated double bond, and 0.01 to 20% by weight for the phosphoric acid-containing resin component. It is more preferably 30 to 70% by weight for the radical polymerizable resin component having an unsaturated double bond, 30 to 80% by weight for the resin component having no unsaturated double bond, and 0.05 to 10% by weight for the phosphoric acid-containing resin component.

On the other hand, in the present invention, as the peeling sheet 8, the one made of a fluorine-containing resin such as polytetrafluoroethylene resin (PTFE), or the one made of a non-silicone-containing material (ex., polypropylene) is preferably used from the viewpoint of facilitating the peeling of the peeling sheet 8 from the adhesive film, and from the viewpoint of allowing the characteristics (adhesion, moisture resistance, and the like) inherent in the adhesive to be sufficiently exhibited.

On the other hand, in the present invention, as the electroconductive particles 7, there are also used metal particles, and the one obtained by providing a metal thin layer having oxidation resistance such as gold (Au) plate on the surface of the metal particle. However, from the viewpoint of ensuring good electric connection, there is preferably used the one including resin particles which will be deformed under pressure as a nucleus, and an electroconductive metal thin layer provided on the surface layer portion thereof.

Further, from the viewpoint of ensuring the insulation properties among the electroconductive particles 7, there is preferably used the one obtained by covering the surface of the metal thin layer of the electroconductive particle 7 with an insulating layer.

Further, the low-temperature setting adhesive of the present invention and the anisotropically electroconductive adhesive film using the same can be manufactured by a conventional method.

Namely, electroconductive particles are dispersed in a binder solution prepared by dissolving the radical polymerizable resin, and the like in an appropriate solvent. The resulting paste is applied onto the peeling sheet, and the solvent is then vaporized by heating or the like, resulting in the objective anisotropically electroconductive adhesive film.

EXAMPLES

Below, examples of the anisotropically electroconductive adhesive film in accordance with the present invention will be described in details together with comparative examples.

Example 1

A solution obtained by mixing respective components at the following ratio was applied onto a PTFE film with a thickness of 50 μm. The solvent was then vaporized so that the residual solvent was in an amount of 1% or less to obtain an anisotropically electroconductive adhesive film with a thickness of 15 p.m.

Incidentally, each component in a solid state out of the following resins was mixed therein while being appropriately dissolved by a solvent, methyl ethyl ketone (MEK).

Liquid epoxy acrylate (manufactured by Kyoeisya Chemical Co., Ltd., 3002A) 25 wt %

Solid epoxy acrylate (manufactured by Showa Highpolymer Co., Ltd., -60) 25 wt %

Phenoxy resin (manufactured by Tohto Kasei Co., Ltd., YP50) 40 wt %

Phosphoric acid acrylate (manufactured by Nippon Kayaku Co., Ltd., PM2) 4 wt %

Vinylsilane coupling agent (peroxyketal manufactured by Nippon Oil & Fats Corp., Perhexa 3M) 3 wt %.

Electroconductive particle (manufactured by Sony Chemicals Corp., Ni/Au-plated acrylic resin particle) 3 wt %

TABLE 1

Composition ratio of Examples and Comparative Examples

| | Epoxy acrylate | | Phenoxy resin | Phosphoric acid acrylate | | Vinyl-silane coupling agent | Phosphate-based coupling agent | Organic peroxide | Electro-conductive |
|---|---|---|---|---|---|---|---|---|---|
| | 3002A | VR-60 | YP50 | PM2 | RDX 63182 | A172 | KR38S | Perhexa 3M | particle |
| Example 1 | 25 | 25 | 40 | 3 | — | 1 | — | 3 | 3 |
| Example 2 | 25 | 25 | 40 | — | 3 | 1 | — | 3 | 3 |
| Example 3 | 25 | 25 | 40 | 0.1 | — | 1 | — | 3 | 3 |
| Comparative Example 1 | — | 25 | 20 | 73 | — | 1 | — | 3 | 3 |
| Example 4 | 25 | 25 | 40 | 3 | — | — | 1 | 3 | 3 |
| Comparative Example 2 | 25 | 25 | 43 | — | — | 1 | — | 3 | 3 |

Example 2

An anisotropically electroconductive adhesive film was manufactured in the same manner as in Example 1, except that the amount of a different type of phosphoric acid acrylate (manufactured by Daicel Chemical Industries, Ltd., RDX63182) to be added was 3% by weight.

Example 3

An anisotropically electroconductive adhesive film was manufactured in the same manner as in Example 1, except that the amount of phosphoric acid acrylate (manufactured by Nippon Kayaku Co., Ltd., PM2) to be added was 0.1% by weight.

Example 4

An anisotropically electroconductive adhesive film was manufactured in the same manner as in Example 1, except that the phosphate-based coupling agent (manufactured by Ajinomoto Co., Inc., KR38S) was added in an amount of 1% by weight in place of the vinylsilane coupling agent (manufactured by Nippon Oil & Fats Corp., Perhexa 3M) as the coupling agent.

Comparative Example 1

An anisotropically electroconductive adhesive film was manufactured in the same manner as in Example 1, except that epoxy acrylate was not added, the amount of phenoxy resin to be added was 20% by weight, and the amount of phosphoric acid acrylate to be added was 73% by weight.

Comparative Example 2

An anisotropically electroconductive adhesive film was manufactured in the same manner as in Example 1, except that the amount of phenoxy resin to be added was 43% by weight, and phosphoric acid acrylate was not added.

TABLE 2

Evaluation results of Examples and Comparative Examples

| | Adhesive strength (gf/cm) | | Continuity resistance ($\Omega$) | |
|---|---|---|---|---|
| | Initial | 60° C. 95% after 500 hr | Initial | 60° C. 95% after 500 hr |
| Example 1 | 865 | 780 | 9.6 | 10.3 |
| Example 2 | 680 | 630 | 9.4 | 11.1 |
| Example 3 | 580 | 250 | 9 | 12 |
| Comparative Example 1 | 330 | 280 | 9.8 | 14 |
| Example 4 | 525 | 520 | 9.5 | 11.4 |
| Comparative Example 2 | 230 | 220 | 9.8 | 12.4 |

Evaluation

Adhesive Strength

Using each anisotropically electroconductive adhesive film (width 2 mm) of Examples and Comparative Examples described above, a plastic liquid crystal panel with a pitch of 200 µm and a flexible printed board were compression bonded under the conditions shown in Table 2, resulting in a sample for evaluating the adhesive strength.

The flexible printed board herein used was a so-called two-layer flexible printed board in which no adhesive layer was present between the base made of polyimide and the conductor made of copper. As the conductor, the one with a thickness of 12 µm was used.

Then, measurements were carried out for the adhesive strengths of initial state immediately after thermo compression bonding, and after conducting a wet-heat resistance reliability test under the conditions of a temperature of 60° C., a relative humidity of 95%, and for 500 hours, respectively. The results are shown in Table 2.

Continuity Resistance

Using an ITO substrate not subjected to etching, a flexible printed board, and each anisotropically electroconductive adhesive film, measurements were carried out for the continuity resistances of initial state immediately after thermo compression boding and after the wet-heat resistance reliability test in accordance with the four-terminal method (JIS C 5012). The results are shown in Table 2.

As shown in Table 2, for the anisotropically electroconductive adhesive films of Examples 1 to 4, good results were obtained in all of adhesion strength and continuity resistance.

On the other hand, for the anisotropically electroconductive adhesive film containing no epoxy acrylate of Comparative Example 1, and the one containing no phosphoric acid component of Comparative Example 2, the adhesive strengths were not good.

Peelability of Peeling Sheet

On the other hand, the anisotropically electroconductive adhesive films of Example 1 described above were formed on a peeling sheet obtained by coating a silicone resin on a PET film, and a peeling sheet made of PTFE, respectively.

Then, a sample plate was stuck through an adhesive tape on the surface of each anisotropically electroconductive adhesive film, resulting in a sample for evaluating the peelability. For each sample for evaluating the peelability, the peeling sheet was pulled off in a direction at right angles thereto to determine the strength per 5-cm width as the peel force. In this case, measurements were carried out for the peel force (initial peel force) immediately after thermo compression bonding, and the peel force after allowing the sample to stand for 1 month under the condition of a temperature of 23° C. (ordinary temperature). The results are shown in Table 3.

Further, for each sample for evaluating the peelability, measurements were carried out for the adhesive strength immediately after thermo compression bonding, and the adhesive strength after allowing the sample to stand for 1 month under the condition of a temperature of 23° C. The results are shown in Table 3.

TABLE 3

Peelability and adhesive strength according to the peeling sheet type

| | Peel force (gf/5 cm) | | Adhesive strength (gf/cm) | |
|---|---|---|---|---|
| | Initial | 23° C. after 1 month | Initial | 23° C. after 1 month |
| PTFE | 30~40 | 30~40 | 865 | 855 |
| PET silicone peeling treatment | 20~30 | 150~200 | 780 | 310 |

As shown in Table 3, for the one using the peeling sheet made of PTFE, good results were obtained in peelability and adhesive strength.

On the other hand, for the one using a peeling sheet obtained by coating a silicone resin on a PET film, the peel force increased, and the sheet becomes difficult to peel and the adhesive strength was also reduced, after a lapse of about one month at ordinary temperature.

It is conceivable that this is attributable to the following fact. That is, the silicone slightly transfers to the surface of the adhesive because of the high affinity between silicone and the adhesive component, resulting in deterioration in characteristics such as adhesive strength and moisture resistance.

As described above, the present invention can provide an insulating adhesive film and an anisotropically electroconductive adhesive film which satisfy requirements of low-temperature curability, high adhesion, and high reliability.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An insulating adhesive film, comprising:
   a peeling sheet; and
   a low-temperature setting adhesive, said adhesive being provided on said sheet by coating and drying, and comprising a cured product of:
      an epoxy acrylate represented by the following formula:

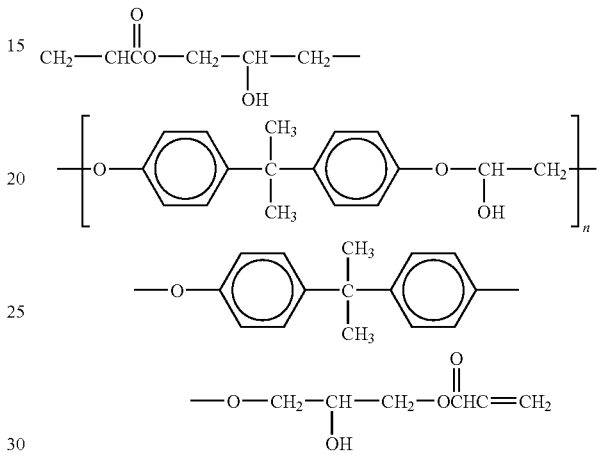

wherein n is from 0 to 20;
   a resin component having no unsaturated double bond;
   a bis(methacryloyloxyethyl)hydrogen phosphate;
   a radical polymerization initiator; and
   a phosphate-based coupling agent comprising Isopropyl-tris(dioctylpyrophosphate)titanate,
   wherein the epoxy acrylate is present in an amount of 15-85% by weight of adhesive, the resin component having no unsaturated double bond is present in the amount of 30 to 90% by weight of the adhesive, and the bis(methacryloyloxyethyl)hydrogen phosphate is present in an amount of 0.01 to 20% by weight of the adhesive.

2. The insulating adhesive film according to claim 1, wherein said bis(methacryloyloxyethyl)hydrogen phosphate component has a radical polymerizable reactive group.

3. An anisotropically electroconductive adhesive film, comprising:
   a peeling sheet;
   a low-temperature setting adhesive provided on said sheet by coating and drying, and comprising a cured product of:
      an epoxy acrylate represented by the following formula:

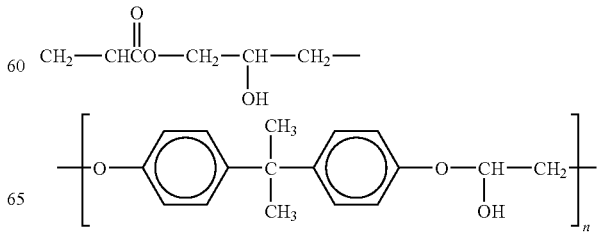

-continued

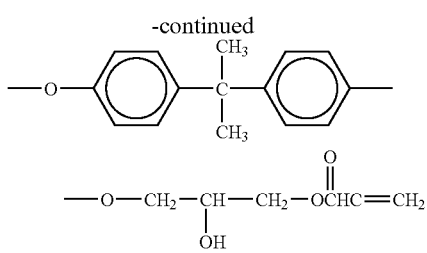

wherein n is from 0 to 20;
a resin component having no unsaturated double bond;
a bis(methacryloyloxyethyl)hydrogen phosphate;
a radical polymerization initiator;
an electroconductive particle dispersed in said low-temperature setting adhesive; and
a phosphate-based coupling agent comprising Isopropyltris(dioctylpyrophosphate) titante,
wherein the epoxy acrylate is present in an amount of 15-85% by weight of adhesive, the resin component having no unsaturated double bond is present in the amount of 30 to 90% by weight of the adhesive, and the bis(methacryloyloxyethyl)hydrogen phosphate is present in an amount of 0.01 to 20% by weight of the adhesive.

4. The anisotropically electroconductive adhesive film according to claim 3, wherein said bis(methacryloyloxyethyl)hydrogen phosphate component has a radical polymerizable reactive group.

5. The anisotropically electroconductive adhesive film according to claim 3, wherein said electroconductive particle comprises a resin particle which is deformed when applied with pressure as a nucleus, and an electroconductive metal thin layer provided on a surface layer portion thereof.

6. The anisotropically electroconductive adhesive film according to claim 4, wherein said electroconductive particle comprises a resin particle which is deformed when applied with pressure as a nucleus, and an electroconductive metal thin layer provided on a surface layer portion thereof.

* * * * *